(12) United States Patent
Schropp

(10) Patent No.: US 6,242,687 B1
(45) Date of Patent: Jun. 5, 2001

(54) AMORPHOUS SILICON PHOTOVOLTAIC DEVICES AND METHOD OF MAKING SAME

(75) Inventor: Rudolf Emmanuel Isidore Schropp, Ge Driebergen (NL)

(73) Assignee: Universiteit van Utrecth (NL)

( * ) Notice: Subject to any disclaimer, the term of this patent is extended or adjusted under 35 U.S.C. 154(b) by 0 days.

(21) Appl. No.: 09/446,029

(22) PCT Filed: Jun. 18, 1998

(86) PCT No.: PCT/EP98/04008

§ 371 Date: Mar. 16, 2000

§ 102(e) Date: Mar. 16, 2000

(87) PCT Pub. No.: WO98/58413

PCT Pub. Date: Dec. 23, 1998

(30) Foreign Application Priority Data

Jun. 18, 1997 (EP) .................................................. 97201856

(51) Int. Cl.[7] .......................... H01L 31/075; H01L 31/20
(52) U.S. Cl. .......................... 136/255; 136/256; 136/258; 257/458; 257/461; 257/464; 257/431; 438/87; 438/88; 438/96; 438/97; 438/57; 438/61
(58) Field of Search .................................... 136/255, 256, 136/258 AM, 258 PC; 257/458, 461, 464, 431; 438/87, 88, 96, 97, 57, 61

(56) References Cited

U.S. PATENT DOCUMENTS

| | | | |
|---|---|---|---|
| 4,160,678 | * 7/1979 | Jain et al. | 136/255 |
| 4,500,744 | * 2/1985 | Nozaki et al. | 136/258 |
| 4,598,164 | * 7/1986 | Tiedje et al. | 136/249 |
| 4,680,607 | * 7/1987 | Fukatsu et al. | 136/255 |
| 4,718,947 | 1/1988 | Arya | 136/258 |
| 4,721,535 | 1/1988 | Itoh et al. | 136/258 |
| 5,563,425 | * 10/1996 | Saito et al. | 135/255 |

FOREIGN PATENT DOCUMENTS 0437767   7/1991   (EP) .

OTHER PUBLICATIONS

K. Miyachi et al., "Fabrication of Single Pin Type Solar Cells with a High Conversion Efficiency of 13.0% Photovoltaic Solar Energy Conference," Oct. 1992, pp. 88–91.
M.W.M. van Cleef et al., "Microcrystalline–Crystalline Silicon Heterojunction Solar Cells Using Highly Conductive Thin P–Type Microcrystalline Silicon Window Layers," 25th PVSC; May 1996; pp. 42–43.
J.K. Rath et al., "Development of Amorphous Silicon Based P–I–N Solar Cell in A Superstrate Structure Wtih P–Microcrystalline Silicon as Window Layer," 25th PVSC; May 1996; pp. 1101–1104.
R.E.I. Schropp et al., "Bandgap–, dopant–, and defect––graded dual–junction amorphous silicon solar cells", European Photovoltaic Solar Energy Conference, Apr. 1994, pp. 699–702.

* cited by examiner

Primary Examiner—Alan Diamond
(74) Attorney, Agent, or Firm—Webb Ziesenheim Logsdon Orkin & Hanson, P.C.

(57) ABSTRACT

A process for producing a thin film semiconductor solar cell, said solar cell at least comprising: a p-type layer, and an n-type layer, which are deposited on carrier material, wherein the composition of the p-type layer, especially the optical band gap and/or the specific conductivity, and/or the composition of the n-type layer, especially the optical band gap and/or the specific conductivity thereof, are varied on a continuous way in time and/or space, by controlling the composition and/or flow of predetermined gases at the location where the respective semiconductor layer is formed.

24 Claims, 4 Drawing Sheets

US 6,242,687 B1

AMORPHOUS SILICON PHOTOVOLTAIC DEVICES AND METHOD OF MAKING SAME

BACKGROUND OF THE INVENTION

1. Field of the Invention

The present application relates to a process for providing photovoltaic thin film semiconductor devices, in particular solar cells and other devices obtainable by such a process. This film semiconducting devices have a wide variety of applications. For example, solar cells incorporating amorphous silicon, microcrystalline silicon or polycrystalline silicon are employed to generate electricity from incident irradiation.

2. Background of the Prior Art

U.S. Pat. No. 4,721,535 discloses a solar cell wherein the p-type layer consists of three layers, which all comprise carbon and of which the middle layer is doped with Boron. As the composition is varied step wise, such layers can not be produced in a continuous process.

In the article "Fabrication of single pin type solar cells with high conversion efficiency of 13.0%" by K. Miyachi et al., a p-type layer is disclosed, which consists of two graded layers. In the first layer, the Carbon concentration is increased by increasing the proportion of dimethyl relative to silane. In the second layer this proportion in decreased. In this publication no doping of the layers is disclosed.

In the European patent application EP-A-0 437 767 a a-SiGe:H is disclosed, wherein a high band gap in the n-type layer is achieved by adding Carbon or Nitrogen. This will cause problems regarding alignment of the bands and a barrier between which the layer will be generated.

SUMMARY OF THE INVENTION

The present invention provides a process in which all the layers of a solar cell, including p-type and/or n-type graded layers are formed in a continuous way. Further the present invention provides a solar cell with high efficiency and produced according to this process.

According to the present invention a process for producing a thin film semiconductor solar cell, said solar cell at least comprising:

a p-type layer; and an n-type layer, which are deposited on carrier material, wherein the composition of the p-type layer, especially the optical band gap and/or the specific conductivity, and/or the composition of the n-type layer, especially the optical band gap and/or the specific conductivity thereof, are varied in a continuous way in time and/or space, by controlling the composition and/or flow of predetermined gasses at the location where the respective semiconductor layer is formed.

Further the present invention provides a thin film semiconductor solar cell, comprising:

a substrate of carrier material;

a p-type layer provided on the substrate; and an n-type layer provided above the p-type layer, wherein the optical band gap and/or the specific conductivity of either the p-type layer or the n-type layer vary spatially.

DETAILED DESCRIPTION OF THE PREFERRED EMBODIMENTS

Figure 1:
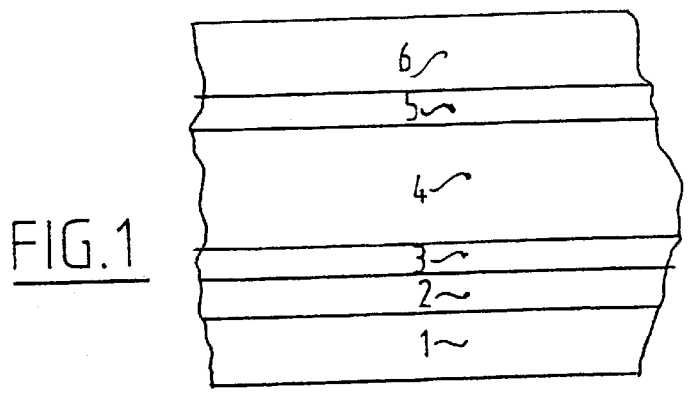
FIG. 1 is a diagram of a solar cell according to the present invention, produced in accordance with a process according to the present invention.

An example of a thin film silicon solar cell structure 10 is as follows: a glass plate 1 is coated with a transparent conductive metal oxide, or a multilayer structure consisting of various transparent metal oxides 2, on top of this metal oxide structure, a thin silicon layer 3 is applied which contains dopant atoms such as boron as well as other alloying agents such as hydrogen and carbon. Then on top of this, a thin silicon layer 4 is applied containing in addition to silicon only hydrogen as a deliberate ingredient. On top of this, a thin silicon layer 5 is applied which contains dopant atoms such as phosphorus as well as hydrogen. On top of this an electrical terminal 6 is applied which preferably is a highly reflective metal, a conductive metal oxide, or a combination of both. The doped silicon layer 3 is preferably less than 100 Å thick, but can be up to 200 Å thick, and is a p-type doped layer. The undoped silicon layer 4 is between 300 Å and 200 000 Å thick, depending on whether this layer is purely amorphous in nature, polycrystalline, or a mixture of small crystals and amorphous connecting tissue, which mixture is referred to as microcrystalline. The doped silicon layer 5 is preferably less than 200 Å thick, but can be up to 2000 Å thick, and is a n-type doped layer.

In thin film solar cells based on silicon, the efficiency of the conversion to irradiant energy to electrical energy is limited due to the relatively poor quality of the doped layers 3 and 5. The efficiency of the dopant atoms in increasing the conductivity is limited, which in turn limits the open circuit voltage of the solar cell structure. Conventional techniques for improving the conductivity of the doped layers by incorporating a higher concentration of dopant atoms do not improve the conversion efficiency of the cell structure, because the doped layers using these techniques have an increased optical absorption coefficient in the range of the spectrum where the undoped layer 4 is most sensitive, which relocates the optical absorption to a space region where it does not significantly contribute to the generation of mobile carriers that can be collected at the electrical terminals.

The design of the p-layer according to the present invention

Figure 2:
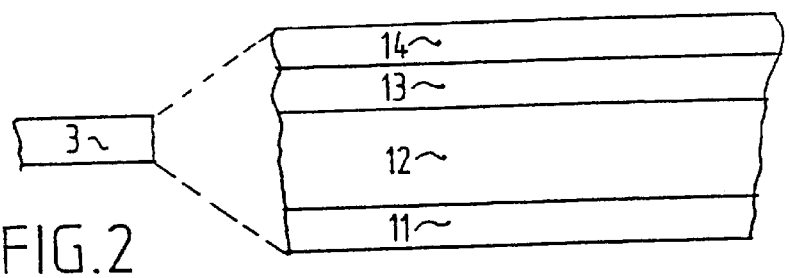
FIG. 2 is a diagram of a preferred embodiment of layer 3 of FIG. 1.

FIG. 2 schematically shows the cross-section of the p-layer according to the invention. This bandgap-engineered p-layer replaces layer 3 in the conventional device 10. The p-layer consists of the following sublayers. The first 6 Å is a layer 11 in which the optical band gap varies from 1.95 to 1.6 eV. The subsequent 54 Å is a layer 12 in which the optical band gap varies from 1.6 eV to 1.95 eV. The conductivity of both layers 11 and 12 is well above $1 \times 10^{-7}$ $\Omega^{-1}$ cm$^{-1}$. On top of this a layer 13 is applied, with a thickness of 14 Å in the body of which the conductivity is varied from above $1\times10^{-7}$ $\Omega^{-1}$ cm$^{-1}$ to below $1\times10^{-10}$ $\Omega^{-1}$cm$^{-1}$ and the band gap is varied from 1.95 eV to a value exceeding 2.1 eV. Finally, a layer 14 with a thickness of 14 Å is applied which has a conductivity below $1\times10^{-10}$ $\Omega^{-1}$ cm$^{-1}$ and an optical band gap which varies from a value higher than 2.1 eV to approximately the band gap of the subsequent undoped layer (layer 4 in structure 10). The thicknesses of the layers 11, 12, 13, and 14 may be varied between 50–200% of the values indicated above. The values indicated above are the preferred thicknesses.

The design of the n-layer according to the present invention

Figure 3:
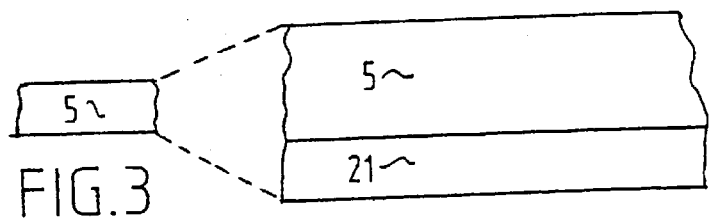
FIG. 3 is a diagram of a preferred embodiment of layer 5 of FIG. 1.

FIG. 3 schematically shows the cross-section of the n-layer according to the invention. This bandgap-engineered n-layer replaces layer 5 in the conventional device 10. The n-layer consists of the following sublayers. The first layer 21 is a layer with a band gap higher than the band gap of the undoped layer 4 and has a thickness of 36 Å. The second layer is a n-type doped layer 5 which can be an amorphous layer or a microcrystalline layer with a thickness preferably less than 200 Å, but may be up to 2000 Å thick.

The process for making the p-layer according to the present invention

The vacuum vessel 33 used to develop the process according to the present invention comprises a gas manifold with gas lines 38, 39, 40, 41, and 42. The exhaust opening of the vessel is equipped with a controllable throttle valve by which the total pressure within the vessel can be kept constant even with varying magnitude of the gas flow. The vessel is equipped with a radiofrequency generator 34; a top metallic plate 31 which is preferably electrically grounded; a bottom metallic plate 32 which is driven by the radiofrequency generator 34. The area of the driven metallic plate 32 is approximately 144 cm$^2$. The distance between the top metallic plate and the bottom driven metallic plate is between 12 and 15 mm. The power from the generator 34 is coupled to the electric system comprising the plates 31 and 32 by means of a matching network by methods known to those skilled in the art. The vacuum vessel also comprises a heater 36, which can be heated to a temperature which is controlled by a thermocouple 37. The present p-layer has been made in a vacuum vessel which was built by Elettrorava SpA, a company based in Italy, who built it under license from MVSystems, Inc., a company based in Colorado, United States of America. A carrier material 35, consisting of a glass plate, 1 mm thick, precoated with a fluorine-doped tin oxide transparent conductive electrical terminal, is arranged on one of the two metallic plates 31 or 32. It is preferably mounted on the top metallic plate 31 with the precoated electrical terminal facing down. The top metallic plate 31 is preferably electrically grounded and the bottom metallic plate 32 is driven by the radiofrequency generator 34. The precoated carrier material is in the proximity of a heater 36 in a vacuum vessel 33. The heater 36 is set to its set temperature, typically in the range of 220° C. to 300° C., and is connected to a thermocouple 37. The precoated carrier material is heated to the desired process temperature, which is between 140° C. and 180° C. while an inert gas, such as argon, is present in the entire vessel 33. When the precoated carrier material has a stabilized temperature which is in the range of the desired process temperature, the argon gas flow is terminated and another gas flow is set up consisting of 20 standard cm$^3$/minute silane, 45 standard cm$^3$/minute methane and 7 standard cm$^3$/minute hydrogen/diborane mixture containing 1 vol.-% diborane. The radiofrequency generator has been preset to yield a power output of 3.5 Watt and an output frequency of 13.56 MHz to the radiofrequency electric system comprising the two metallic plates 31 and 32. The generator at this point is not yet switched on. The matching network is preset to conditions known to yield a reflected power near zero at a forward power of 3.5 Watt. The total pressure of the gas within the vessel is 0.7 millibar, and this pressure is maintained throughout the rest of the procedure. Once the gas flow is stabilized, the radiofrequency generator is switched on which initiates a discharge in the gas mixture. Immediately upon initiation of the discharge the methane constituent of the gas mixture is cut off by closing a valve 48 near to the vessel 33 in the methane gas line 38. This causes a decaying methane content in the vessel while the semiconductor layer is forming. This causes the desired spatial band gap variation as in layer 11 according to the invention. The time needed to build up the thicknesses of the various layers according to the present invention is derived from the deposition rate determined from various separately deposited films at well defined conditions. When 6 Å of the semiconductor layer is built up, which is achieved in 3 seconds, the methane gas flow is again increased in a controlled way by increasing the gas flow linearly in time up to 45 standard cm$^3$/minute during deposition in a time span sufficient to built up layer 12 with a thickness of 54 Å. This time span is 27 seconds. Upon completion of this layer, the hydrogen/diborane mixture constituent of the gas mixture is cut off by closing a valve 49 near to the vessel 33 in the hydrogen/diborane gas line 39. This causes a decaying hydrogen and diborane content in the vessel while the semiconductor layer is forming. This in turn causes the desired spatial band gap variation as well as the spatial conductivity variation as in layer 13 according to the invention. When 14 Å of the semiconductor layer is built up, which takes 7 seconds, after closing the valve in the hydrogen/diborane gas line 39, also the valve in the methane gas line 38 is closed again and a further 14 Å is allowed to build up in the next 7 seconds. This causes the desired spatial band gap variation as in layer 14 according to the invention. After completion of layer 14 the discharge is terminated by switching of the radiofrequency generator, so that there is no further build up of semiconductor layer.

The silicon structure is completed by applying an undoped layer and an n-type layer with methods know to those skilled in the art. Alternatively, the n-type layer is formed according to the present invention.

The p-layer according to the design according to the present invention can be made using diborane, trimethylboron, or any other dopant gas known to dope silicon p-type. The p-layer according to the design according to the present invention can be made using methane, carbon oxide, or any other agent known to increase the band gap. The hydrogen in the above example may be replaced by helium, but hydrogen is the preferred gas.

The process for making the p-layer according to the design of the present invention can also be applied to a carrier material that is not stationary in the vacuum vessel, for example, in the case of a continuously moving carrier material by constructing a multitude of gas zones through each of which an accurately defined gas mixture flows.

The process for making the n-layer according to the present invention

By constructing a multitude of gas zones for making the n-type layer and p-type layer according to the present invention, production throughput will be improved, as well as the homogeneity of the deposited layers. The composition of the gas mixture in each gas zone can be accurately controlled for achieving those advantages.

The vacuum vessel 33 used to develop the process according to the present invention is equivalent to that for making the p-layer and is described in the process for making the p-layer according to the present invention. However, the distance between the top metallic plate and the bottom driven metallic plate now is between 20 and 25 mm. The carrier material is arranged on one of the two metallic plates 31 or 32. The carrier material may be precoated with an electrical terminal, with a p-doped thin film, with an undoped thin film or a multilayer structure consisting of any number of these precoatings. For the purpose of the present invention it is a glass plate precoated with a fluorine-doped tin oxide transparent conductive electrical terminal, on top of which a p-doped and an undoped thin film have been successively deposited. The carrier material is preferably mounted on the top metallic plate 31 with the precoating films facing down. The top metallic plate 31 is preferably electrically grounded and the bottom metallic plate 32 is driven by the radiofrequency generator. The precoated carrier material is in the proximity of a heater 36 in a vacuum vessel 33. The heater 36 is set to its set temperature, typically in the range of 300° C. to 350° C., and is connected to a thermocouple 37. The precoated carrier material is heated to the desired process temperature, which is between 180° C. and 220° C. while an inert gas, such as argon, is present in the entire vessel 33. When the precoated carrier material has a stabilized temperature which is in the range of the desired process temperature, the argon gas flow is terminated and another gas flow is set up consisting of 40 standard cm3/minute silane and 11 standard cm3/minute hydrogen. The radiofrequency generator has been preset to 3 Watt and an output frequency of 13.56 MHz to the radiofrequency electric system comprising the two metallic plates 31 and 32. The generator at this point is not yet switched on. The matching network is preset to conditions known to yield a reflected power near zero at a forward power of 3.5 Watt. The total pressure of the gas within the vessel is 0.5 millibar, and this pressure is maintained throughout the rest of the procedure. Once the gas flow is stabilized, the radiofrequency generator is switched on which initiates a discharge in the gas mixture. After 28 seconds of discharge, which will be defined as deposition cycle, the silane constituent of the gas mixture is cut off by closing a valve near to the vessel 33 in the silane gas line 38. At the same time the hydrogen flow is increased to 100 standard cm3/minute. This situation is maintained for 20 seconds. During the latter 20 seconds the previously deposited layer undergoes a treatment which alters its thickness and properties. This treatment will be defined as hydrogen treatment. After this treatment the previous silane/hydrogen mixture is re-established and the deposition cycle is maintained for a duration of 28 seconds. After the deposition cycle, the hydrogen treatment is again applied. The alternating deposition cycles and hydrogen treatments can be applied 1 to 10 times, but two times is the preferred number. This produces the desired material with a band gap larger than the band gap of the undoped material 4 with the desired thickness. The n-layer is completed with a conventional n-layer using methods known to those skilled in the art.

The n-layer according to the design according to the present invention can be made using phosphine, arsene, or any other dopant gas known to dope silicon n-type. The hydrogen in the above example may be replaced by helium, but hydrogen is the preferred gas.

The process for making the n-layer according to the design of the present invention can also be applied to a carrier material that is not stationary in the vacuum vessel, for example, in the case of a continuously moving carrier material by constructing a multitude of gas zones through each of which an accurately defined gas mixture flows.

By constructing a multitude of gas zones for making the n-type layer and p-type layer according to the present invention, production throughput will be improved, as well as the homogeneity of the deposited layers. The composition of the gas mixture in each gas zone can be accurately controlled for achieving those advantages.

Figure 4:
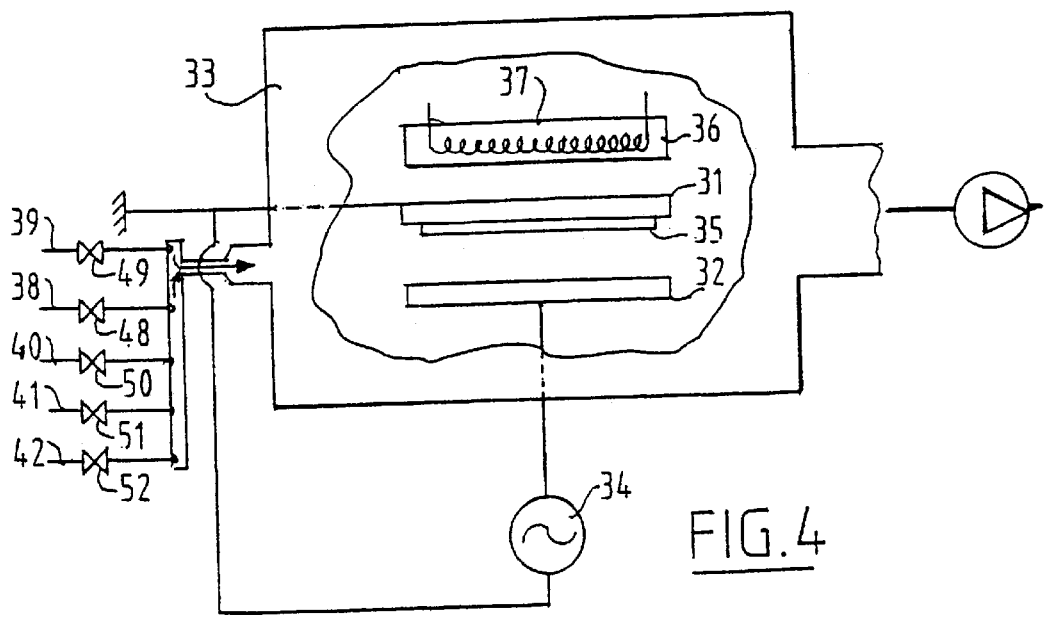
FIG. 4 is a schematic side view of an apparatus for carrying out a preferred embodiment of the method according to the present invention.

Thin film silicon solar cells are usually made using the plasma enhanced chemical vapor deposition (PECVD) method. Between two metallic plates 31, 32 (FIG. 4) separated typically by 8 mm–80 mm, the source gas mixtures are dissociated by an alternating electric field. The plates 31, 32 are enclosed in a vacuum vessel 33. The electrical field is generated by a radiofrequency generator 34 and the voltage signal typically has a frequency in the range of 13 million to 150 million Hertz. The radiofrequency power is usually limited to 5 Watt, depending on the size of the area of the carrier material 35 to be deposited on. On forming a semiconductor on the carrier material 35, the source gases are guided into the vacuum vessel 33, and the radiofrequency generator is switched on. The carrier material is heated to a predetermined temperature of between 140° C. and 350° C., whereby the flow of the source gas mixture is between 20 and 100 standard cm3/minute (sccm) and wherein the vessel a pressure is maintained between 0.2 and 2 millibar.

Figure 5:
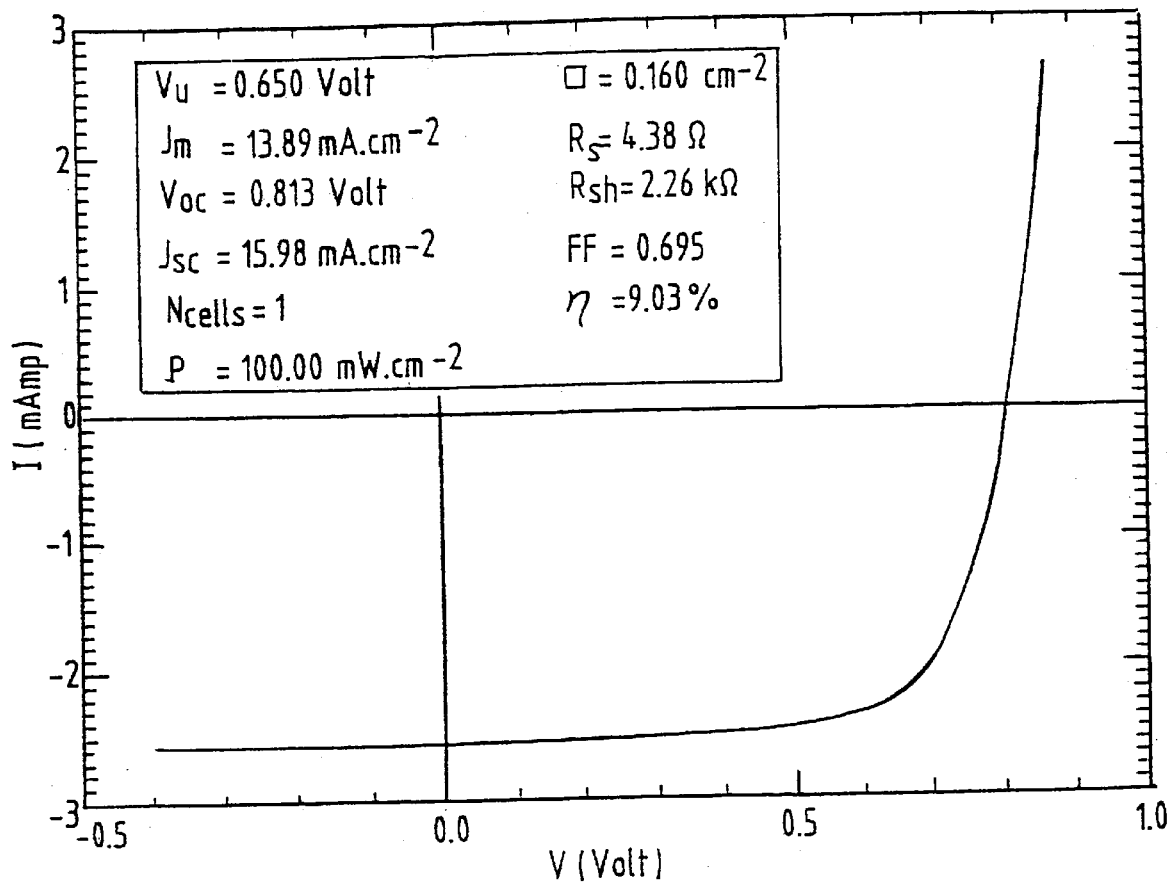
FIG. 5 is a graph of a current voltage curve for a thin film silicon solar cell obtained according to a prior art process.
Figure 6:
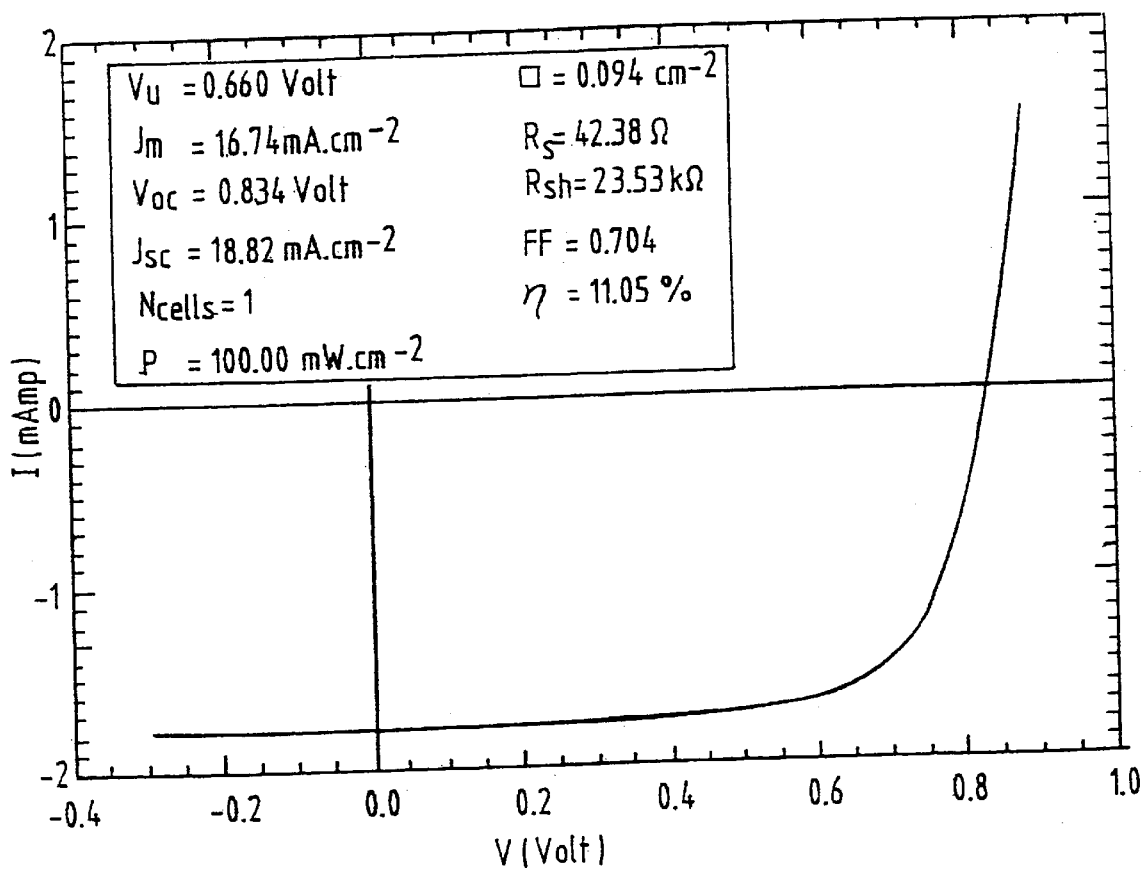
FIG. 6 is a graph of the current voltage curve relating to the p-type layer for a preferred embodiment of a thin film silicon solar cell obtained according to the present invention.
Figure 7:
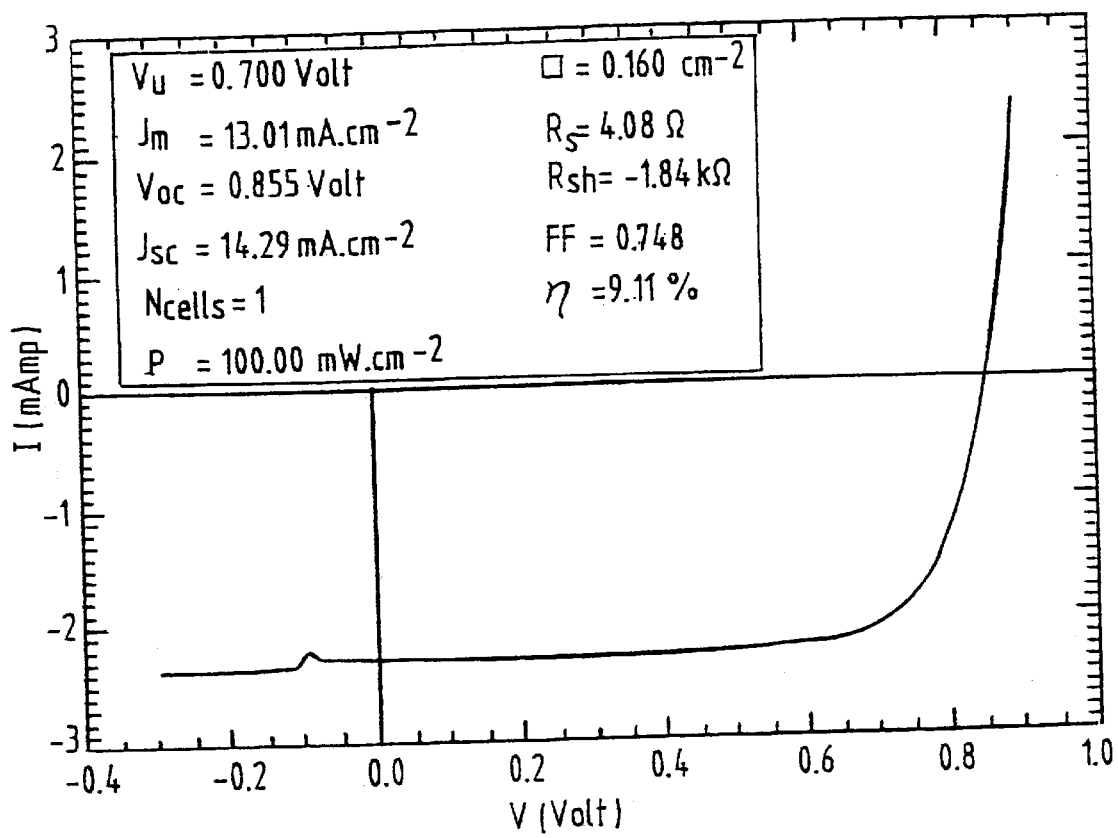
FIG. 7 is a graph of the current voltage curve relating to the n-type layer for a preferred embodiment of a thin film silicon solar cell obtained according to the present invention.

FIG. 5 shows a graph of the current-voltage curve for a thin film silicon solar cell obtained according to the known method. FIG. 6 shows a graph of the current-voltage curve for a thin film silicon solar cell obtained according to the present invention relating to the p-layer of the cell structure. FIG. 7 shows a graph of the current-voltage curve for a thin film silicon solar cell obtained according to the present invention relating to the n-layer of the cell structure.

What is claimed is:

1. A process for producing a thin film silicon solar cell, said solar cell comprising a substrate of carrier material, a p-type layer connected to a first electrical terminal, an intermediate layer for absorbing the produced charge carriers, and an n-type layer electrically connected to a second electrical terminal, wherein the composition of at least one layer is varied by controlling the composition and flow of gases at the location where a respective layer is formed, wherein the p-layer is formed by the following steps:

subjecting the substrate with electrical terminal thereon to a discharge of a gas mixture including silane, a dopant gas, an agent for increasing the band gap, and a gas selected from the group consisting of hydrogen and helium;

subsequently decreasing the content of the band gap increasing agent in the gas mixture;

subsequently increasing the content of the band gap increasing agent;

subsequently decreasing the content of the dopant gas and the gas selected from the group consisting of hydrogen and helium;

subsequently decreasing the content of the band gap increasing agent; and in that the n-layer is formed by the following steps:

subjecting the substrate with one or more layers to a discharge of a gas mixture including silane, a dopant gas, and a gas selected from the group consisting of hydrogen and helium;

subsequently decreasing the silane constituent of the gas mixture, and increasing the content of the gas mixture of the gas selected from the group consisting of hydrogen and helium.

2. The process according to claim 1, wherein the first decrease of the content of the band gap increasing agent in the gas mixture is immediately effected after the discharge of the gas mixture and is continued during a time period of about 3 seconds.

3. The process according to claim 1, wherein the subsequent increase of the band gap increasing agent is continued during a time period of about 27 seconds.

4. The process according to claim 1, wherein the subsequent decrease of the content of the dopant gas and the gas selected from the group consisting of hydrogen and helium is continued for a time period of about 7 seconds.

5. The process according to claim 1, wherein the decrease of the content of the dopant gas and the gas selected from the group consisting of hydrogen and helium is continued for a time period of about 7 seconds.

6. The process according to claim 1, wherein the subsequent decrease of the silane constituent of the gas mixture is effected after about 28 seconds of the start of the discharge of the gas mixture and is continued for about 20 seconds.

7. The process according to claim 1, wherein each subsequent decrease of the content of the band gap increasing agent is maintained for a time period of about 28 seconds.

8. The process according to claim 1, wherein the increases and decreases of the silane, dopant gas, agent for increasing the band gap, and gas selected from the group consisting of hydrogen and helium are obtained by closing and opening respectively of gas lines to the location where a respective layer is formed.

9. The process according to claim 1, wherein the substrate is moved through a number of gas zones in each of which an accurately defined gas mixture is present.

10. The process according to claim 1, wherein a pressure is maintained between 0.2 and 2 mBar.

11. A thin film silicon solar cell, comprising a substrate of carrier material, a p-type layer provided on the substrate and operatively connected to a first electrical terminal and an n-type layer, provided above the p-type layer operatively connected to a second electrical terminal, wherein the optical band gap and the specific conductivity of both the p-type layer and the n-type layer vary spatially in a continuous way, said p-type layer includes a doped sublayer close to said first electrical terminal, and in which the optical band gap decreases in the direction away from said first electrical terminal and in that said n-type layer includes at least two sublayers.

12. The thin film silicon solar cell according to claim 11, in which the p-type doped sublayer has a thickness of about 6 Å, in which layer the optical band gap varies from about 1.95 to 1.6 eV.

13. The thin film silicon solar cell according to claim 11, in which a first sublayer of the n-type layer has a thickness of about 36 Å and a second sublayer of said n-type layer has a thickness of about 200–2,000 Å.

14. The thin film silicon solar cell according to claim 11, wherein the p-type layer includes at least three further sublayers.

15. The thin film silicon solar cell according to claim 14, in which a first further sublayer of the p-type layer has a thickness of about 54 Å, the optical band gap of which varies from 1.6 eV to 1.95 eV.

16. The thin film silicon solar cell according to claim 14, wherein a second further sublayer of the p-type layer has a thickness of about 14 Å, in the body of which layer the conductivity is varied from about $1 \times 10^{-7}$ $\Omega^{-1}$ $cm^{-1}$ to about $1 \times 10^{-10}$ $\Omega^{-1}$ $cm^{-1}$ and the band gap is varied from 1.35 eV to a value exceeding 2.1 eV.

17. The thin film silicon solar cell according to claim 14, wherein a third further sublayer of the p-type layer has a thickness of about 14 Å, a conductivity below $1 \times 10^{-10}$ $\Omega^{-1}$ $cm^{-1}$ and an optical band gap varying from a value higher than 2.1 eV to approximately the band gap of a subsequent intermediate layer.

18. The thin film silicon solar cell according to claim 11, in which the carrier material is precoated with an electrical terminal.

19. The thin film silicon solar cell according to claim 11, in which the carrier material is provided with a multi-layer structure consisting of an electrical terminal, an n-type layer, and an undoped layer.

20. The thin film silicon solar cell according to claim 11, in which the carrier material is a sheet made of glass, metal, semiconductor, polymers or plastic.

21. The thin film silicon solar cell according to claim 11, wherein the second electrical terminal is a coating made of metal, metal oxide, doped metal oxide, or a combination thereof.

22. The thin film silicon solar cell according to claim 11, wherein an intermediate layer adjacent to either the p-type layer or the n-type layer includes microcrystalline silicon.

23. The thin film silicon solar cell according to claim 11, wherein an intermediate layer adjacent to either the p-type layer or the n-type layer includes polycrystalline silicon.

24. The thin film silicon solar cell according to claim 11, wherein an intermediate layer adjacent to either the p-type layer or the n-type layer includes monocrystalline silicon.

* * * * *